(12) United States Patent
Afshari et al.

(10) Patent No.: US 8,797,105 B2
(45) Date of Patent: Aug. 5, 2014

(54) TUNABLE SIGNAL SOURCE

(71) Applicant: Cornell University with its principle place of business at Cornell Center for Technology Enterprise & Comm, Ithaca, NY (US)

(72) Inventors: Ehsan Afshari, Ithaca, NY (US); Yahya M. Tousi, San Jose, CA (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 13/573,773

(22) Filed: Oct. 4, 2012

(65) Prior Publication Data

US 2013/0082785 A1 Apr. 4, 2013

Related U.S. Application Data

(60) Provisional application No. 61/542,969, filed on Oct. 4, 2011.

(51) Int. Cl.
*H03B 27/00* (2006.01)

(52) U.S. Cl.
USPC .............. 331/46; 331/48; 331/50; 331/167; 331/135; 333/231

(58) Field of Classification Search
USPC ........ 331/2, 46, 45, 135, 117 R, 167, 117 FE, 331/48, 50; 333/231
See application file for complete search history.

(56) References Cited

U.S. PATENT DOCUMENTS

| 6,970,048 | B1 | 11/2005 | Devnath et al. |
| 7,352,253 | B2* | 4/2008 | Jacobsson et al. ............. 331/57 |
| 7,786,816 | B2* | 8/2010 | Dally et al. .................. 331/172 |
| 8,115,560 | B2 | 2/2012 | Chung |
| 8,130,049 | B2 | 3/2012 | Huang et al. |
| 2006/0181356 | A1 | 8/2006 | Park et al. |
| 2007/0057740 | A1 | 3/2007 | Ryu et al. |
| 2011/0026432 | A1 | 2/2011 | Gruber et al. |

OTHER PUBLICATIONS

Adler, R., "A study of locking phenomena in oscillators," Proceedings of the IRE, vol. 36, Jun. 1946, pp. 351-357, IEEE.
Buckwalter, J. F. et al., "An integrated subharmonic coupled-oscillator scheme for a 60-GHz phased-array transmitter," IEEE Transactions on Microwave Theory and Techniques, vol. 54, No. 12, Dec. 2006, pp. 4271-4280, IEEE.
Cusmai, G. et al., "A magnetically tuned quadrature oscillator," IEEE Journal of Solid-State Circuits, vol. 42, No. 12, Dec. 2007, pp. 2870-2877, IEEE.
Huang, D. et al., "324GHz CMOS frequency generator using linear superposition technique," 2008 International Solid-State Circuits Conference Dig. Tech. Papers, Feb. 2008, pp. 476-629, IEEE.

(Continued)

*Primary Examiner* — Arnold Kinkead
(74) *Attorney, Agent, or Firm* — Withrow & Terranova, P.L.L.C.

(57) ABSTRACT

The present disclosure provides a tunable signal source having a plurality of oscillator cores having a coupling input, a coupling output, and a power output that is common to each of the plurality of oscillator cores. Also included is a plurality of tunable phase shifters wherein corresponding ones of the plurality of tunable phase shifters are communicatively coupled between the coupling input and the coupling output of corresponding ones of the plurality of oscillator cores, thereby forming a loop of alternating ones of the plurality of oscillator cores and alternating ones of the plurality of tunable phase shifters.

19 Claims, 19 Drawing Sheets

(56) References Cited

OTHER PUBLICATIONS

Huang, D. et al., "Terahertz CMOS frequency generator using linear superposition technique," IEEE Journal of Solid-State Circuits, vol. 43, No. 12, Dec. 2008, pp. 2730-2738, IEEE.

Kwok, K. et al., "A 23-to-29 GHz Transconductor-Tuned VCO MMIC in 0.13 μm CMOS," IEEE Journal of Solid-State Circuits, vol. 42, No. 12, Dec. 2007, pp. 2878-2886, IEEE.

Liao, P. et al., "A new phase-shifterless beam-scanning technique using arrays of coupled oscillators," IEEE Transactions on Microwave Theory and Techniques, vol. 41, No. 10, Oct. 1993, pp. 1810-1815, IEEE.

Lynch, J.J. et al., "Synchronization of oscillators coupled through narrow-band networks," IEEE Transactions on Microwave Theory and Techniques, vol. 49, No. 2, Feb. 2001, pp. 237-249, IEEE.

Meni, O. et al., "High power terahertz and millimeter-wave oscillator design: a systematic approach," IEEE Journal of Solid-State Circuits, vol. 46, No. 3, Mar. 2011, pp. 583-597, IEEE.

Ojefors, E. et al., "Active 220- and 325-GHz frequency multiplier chains in an SiGe HBT technology," IEEE Transactions on Microwave Theory and Techniques, vol. 59, No. 5, May 2011, pp. 1311-1318, IEEE.

Rong, S. et al, "Design and analysis of varactor-less interpolative-phase-tuning millimeter-wave LC oscillators with multiphase outputs," IEEE Journal of Solid-State Circuits, vol. 46, No. 8, Aug. 2011, pp. 1810-1819, IEEE.

Sengupta, K. et al., "Distributed active radiation for THz signal generation," 2011 International Solid-State Circuits Conference Dig. Tech. Papers, Feb. 2011, pp. 288-289, IEEE.

Seo, M. et al., "InP HBT IC Technology for Terahertz Frequencies: Fundamental Oscillators up to 0.57 THz," IEEE Journal of Solid-State Circuits, vol. 46, No. 10, Oct. 2011, pp. 2203-2214, IEEE.

Tousi, Y.M. et al., "A 283-to-296GHz VCO with 0.76mW peak output power in 65nm CMOS," 2012 International Solid-State Circuits Conference Dig. Tech. Papers, Feb. 2012, pp. 258-260, IEEE.

Tousi, Y.N. et al., "Delay coupled oscillators for frequency tuning of solid-state terahertz sources," Physical Review Letters, vol. 108, No. 23, Jun. 8, 2012, 5 pages, American Physical Society.

York, R.A., "Nonlinear analysis of phase relationships in quasi-optical oscillator arrays," IEEE Transactions on Microwave Theory and Techniques, vol. 41, No. 10, Oct. 1993, pp. 1799-1809, IEEE.

York, R. et al., "Quasi-optical power combining using mutually synchronized oscillator arrays," IEEE Transactions on Mircowave Theory and Techniques, vol. 39, No. 6, Jun. 1991, pp. 1000-1009, IEEE.

* cited by examiner

TUNABLE SIGNAL SOURCE

RELATED APPLICATIONS

This application claims the benefit of U.S. provisional patent application No. 61/542,969, filed Oct. 4, 2011, the disclosure of which is incorporated herein by reference in its entirety.

GOVERNMENT SUPPORT

This invention was made with government funds under Contract No. 2009-CT-2047 awarded by DARPA. The U.S. Government has certain rights in this invention.

FIELD OF THE DISCLOSURE

Embodiments of the present disclosure relate to tunable signal sources such as voltage controlled oscillators (VCOs) and in particular to terahertz VCOs, which may be used in radio frequency (RF) communications systems, remote sensing, and medical imaging, or any combination thereof.

BACKGROUND

The last few years have witnessed a surge in mm-wave integrated circuits mainly because of the increased cut-off frequency of complementary metal oxide semiconductor (CMOS) transistors. These integrated systems target applications such as wide-band communication, remote sensing and medical imaging. Moreover, recent works have shown the possibility of implementing CMOS circuits at sub-mm-wave and terahertz (THz) frequencies, which are defined from 300 GHz to 3 THz. This is motivated by the higher communication bandwidth and better imaging resolution in addition to new applications such as integrated terahertz spectroscopy. Despite all recent advances in this frequency range, a high power tunable signal source has remained a challenging yet essential circuit block needed for the realization of a complete terahertz system.

In inductor-capacitor (LC)-resonator-based VCOs, varactors are placed in the resonator in order to tune the oscillating frequency. This tuning method works well at radio frequencies and achieves moderate tunability at lower mm-wave frequencies (<100 GHz). However, there are at least two major challenges in using varactors for frequency tuning above 100 GHz. First, at these frequencies the varactor quality (Q) factor is low. This lowers the achievable output power and degrades the phase noise performance. Secondly, as the operation frequency increases, parasitic capacitances dominate oscillator tank circuits that employ varactors, thus limiting the tuning capability of varactors. These challenges impose an important trade-off in the design of high frequency oscillators. Typically, CMOS oscillators designed for operation above 100 GHz with high output power do not use varactors. As a result, the frequency of such CMOS oscillators cannot be dynamically tuned. Conversely, tunable oscillators designed for operation above 100 GHz provide very low output powers (<1 µW) due to the use of tuning varactors. As a result of these challenges, significant power generation combined with dynamic tuning for generating signals having frequencies above 150 GHz is dominated by the use of frequency multiplier type circuits. Frequency multiplication requires a high-power external source, which is not desirable in a fully integrated tunable signal source that operates at terahertz frequencies.

To address this challenge, related art tunable signal sources for lower frequencies have focused on tuning the oscillation frequency without using varactors. Magnetically tuned and transconductance tuned VCOs are two examples where, instead of capacitive tuning, an effective inductor of an oscillator tank circuit is tuned. Both of these tuning techniques still require additional active devices inside the oscillator tank circuit. A recent work has used an interpolative-phase-tuning technique in an LC ring oscillator at the mm-wave frequency range. All of these techniques have been used to generate output powers well below the cut-off frequency of the transistors. In order to realize a high power VCO at the sub-mm-wave and terahertz band, three requirements need to be satisfied. What is needed is a tunable signal source that generates high harmonic power above the $f_{max}$ of the devices making up the tunable signal source. Another requirement is that the generated power be efficiently delivered to an output load. A further requirement is a frequency tuning mechanism that will not adversely affect the generation of high harmonic power or adversely affect the efficient delivery of the high harmonic power to the output load.

SUMMARY

The present disclosure provides a tunable signal source having a plurality of oscillator cores having a coupling input, a coupling output, and a power output that is common to each of the plurality of oscillator cores. Also included is a plurality of tunable phase shifters wherein corresponding ones of the plurality of tunable phase shifters are communicatively coupled between the coupling input and the coupling output of corresponding ones of the plurality of oscillator cores, thereby forming a loop of alternating ones of the plurality of oscillator cores and alternating ones of the plurality of tunable phase shifters.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
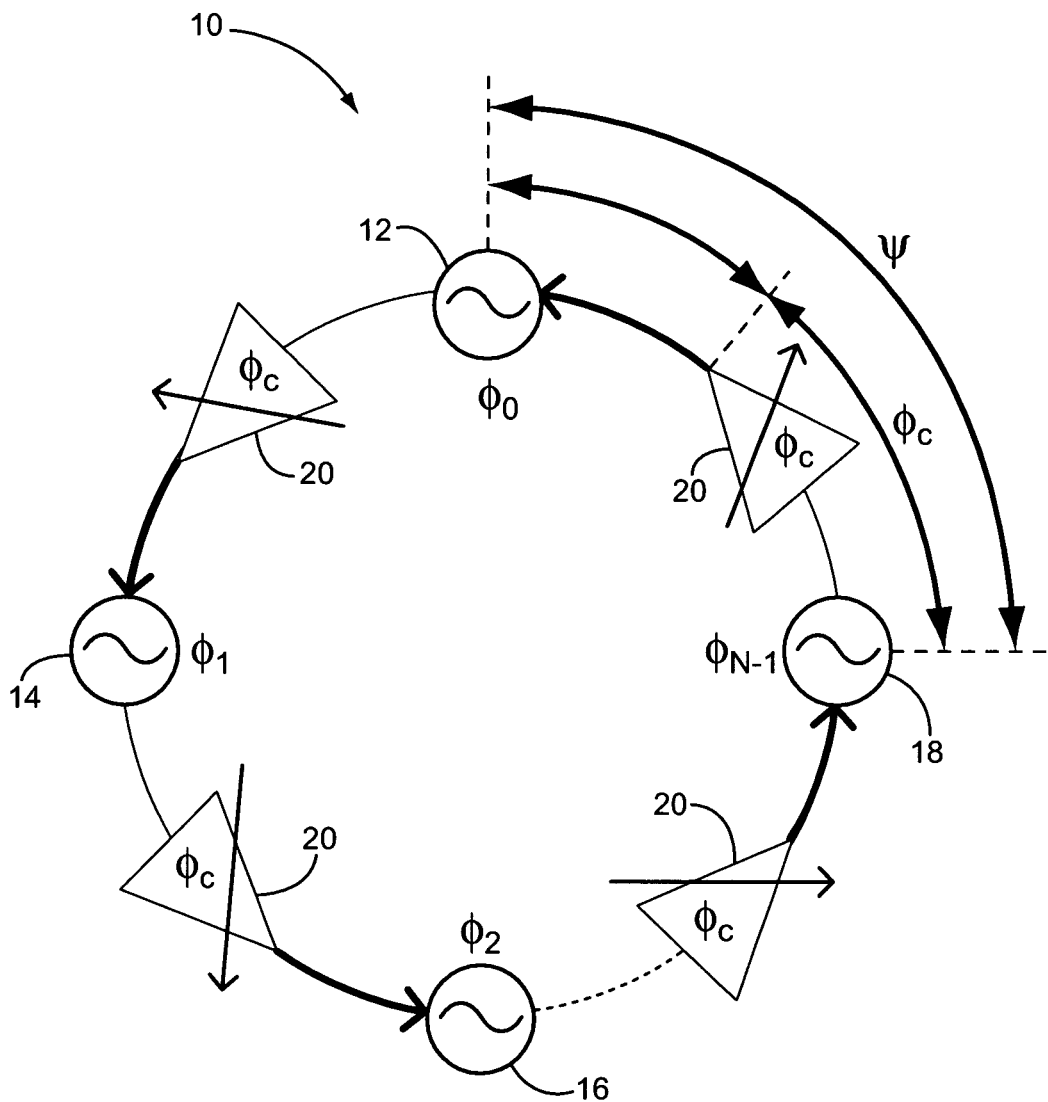
FIG. 1 is a diagram of a loop structure for a tunable signal source of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims. Like numbers refer to like elements throughout.

Theory of Coupled Oscillators

The interaction between two electrical oscillators and its dynamics has been studied in the context of injection locking. Based on analysis, when an oscillator operating at a first frequency $\omega_1$ injects energy to another one with a free-running oscillation frequency of $\omega_0$, under locking conditions, the second oscillator follows the first with an equal frequency and a phase shift of $$\Delta\phi = \sin^{-1}\left(2Q \frac{I_{core}}{I_{inj}} \cdot \frac{\Delta\omega}{\omega_0}\right), \quad (1)$$

where $\Delta\phi$ is the phase difference developed as a result of the frequency difference $\Delta\omega = \omega_1 - \omega_0$. In equation (1), Q represents the quality factor of the resonator, and $I_{core}$ and $I_{inj}$ are the currents delivered to the resonator from active element(s) and an injecting source, respectively. The equation (1) relation also yields the locking range by finding the frequency difference $\Delta\omega$ at which $|\Delta\phi|=\pi/2$. As equation (1) implies, lowering the quality factor Q and increasing the amplitude of the injected signal results in a wider locking range.

The lower and upper bounds of the locking range are derived by finding the frequencies where the phase shift equals to $-\pi/2$ and $\pi/2$, respectively. Intuitively, at these frequencies, an in-phase component of the injected signal disappears. As a result, the injected signal has practically no effect on the dynamics of a main oscillator. This frequency locking phenomena has been applied to electrical oscillators for applications including frequency division, coupled radiation systems and beam-steering. The main similarity between each of these systems is that there is an external signal source that drives one or more coupled oscillators that eventually synchronize them in order to the external source.

Coupled systems do not necessarily need an external source and can rely on internal couplings to synchronize. A related art study exploits passive mutual coupling between an array of oscillators to synchronize them to facilitate spatial power combining. In general, the method of coupling and its dynamics as well as the geometry of the coupled system can be engineered for a diverse range of functionalities. As an example, this disclosure provides a particular coupling topology between N oscillator cores that controls the frequency of the oscillators and imposes a constant desired phase shift between them. As disclosed later, this constant phase shift is critical in harmonic power combining from oscillator cores.

Actively Coupled Oscillators

It may be observed from equation (1) that while a phase shift is developed as result of the frequency difference between the oscillator cores, the reverse phenomena is also possible. FIG. 1 is a diagram of a loop structure for a tunable signal source 10 of the present disclosure. The tunable signal source 10 is a system made up of coupled oscillator cores 12, 14, 16, and 18 along with a plurality of coupling blocks 20. If the phase shift between an injected signal and one of the oscillator cores 12 is changed, the locking frequency is forced to change. In a conventional locking scheme this cannot happen because the frequency of the injecting signal is fixed and the phase difference is dictated by equation (1). In contrast, in a coupling scheme that only relies on internal couplings, the locking frequency is determined based on internal parameters of the system. Generally, the tunable signal source 10 comprises a loop of N coupled oscillator cores, which in this case are represented by oscillator cores 12, 14, 16, and 18. The plurality of coupling blocks 20 provide phase shifting and buffering between the oscillator cores 12, 14, 16, and 18. In this case, the $i^{th}$ oscillator core 14 injects energy into the $(i+1)^{th}$ oscillator core 16 while receiving energy from the $(i-1)^{th}$ oscillator core 12, which in turn receives energy from the adjacent oscillator core 18. The coupling between consecutive oscillator cores is performed by a tunable phase shift.

In order to analyze the dynamics of this system made up of the plurality of oscillator cores 12 through 18 and coupling blocks 20, this disclosure assumes sinusoidal coupling between adjacent oscillator cores, which is a good approximation for operation close the resonance frequency. Under this assumption, if $\phi_i$ is the rotating phase of the $i^{th}$ oscillator core 14 and all the oscillator cores 12 through 18 have a similar free running oscillating frequency of $\omega_0$, the phase dynamics can be described by $$\dot{\phi}_i = \omega_0 + K\sin(\phi_{i-1} + \phi_c - \phi_i), \quad (2)$$

$$\text{where } K = \frac{I_{inj}}{I_{core}} \frac{\omega_0}{2Q}$$

is the coupling factor and $\phi_c$ is the phase shift resulting from the corresponding ones of the plurality of coupling blocks 20. In this scheme all phase shifts are assumed to be equal.

By defining $\psi_i = \phi_i - \phi_{i-1}$ as the instantaneous phase shift between adjacent ones of the oscillator cores 12 through 18, the set of equations described by (2) can be rewritten as $$\dot{\psi} = K \sin(\phi_c - \psi_i) - K \sin(\phi_c - \psi_{i-1}) \quad (3)$$

This relation describes the dynamics of $\psi_i$, the phase difference between adjacent ones of the oscillator cores 12 through 18 in the loop structure of the tunable signal source 10. A complete description of the dynamics of $\psi_i$ will include a boundary condition of the loop of alternating ones of the oscillator cores 12 through 18 and alternating ones of the coupling blocks 20. The total phase shift around the loop is fixed:

$$\sum_i \psi_i = 2k\pi, \quad (4)$$

where k is an integer. The solution to the above set of differential equations (2) and (3) describes the phase dynamics of the system which also results in the stable solutions.

Stability Analysis

A steady state solution to equation (3) is determined by finding the values of $\phi_c$ that satisfy $\dot{\psi}=0$. From equation (3), the solutions for each differential equation (2) and (3) can be either $\Psi_i = \Psi_{i-1}$ or $\Psi_i = 2\phi_c - \pi/2 - \Psi_{i-1}$ where $\Psi$ is the steady-state solution of $\psi$ for all N differential equations. However, the loop condition (4) is satisfied for all values of $\phi_c$ only when $$\Psi_i \Psi_{i-1} = \Psi. \quad (5)$$

Furthermore, for this solution to be stable, a small perturbation must attenuate in time and bring the system back to its original state. By applying a perturbation of $\eta_i$ to this solution the following relationship is formed:

$$\Psi_i = \Psi + \eta_i. \quad (6)$$

By replacing equation (6) into equation (3), the dynamics of the perturbed system is derived:

$$\dot{\eta}_i = K \sin(\phi_c - \Psi - \eta_i) - K \sin(\phi_c - \Psi - \eta_{i-1}), \quad (7)$$

and for a small perturbation around the solution and by substituting equation (3) for $\dot{\psi}=0$, equation (7) becomes $$\dot{\eta}_i = K \cos(\phi_c - \Psi)\eta_{i-1} - K \cos(\phi_c - \Psi)\eta_i. \quad (8)$$

This results in a set of linear differential equations in the form of $$\dot{H} = A \cdot H, \quad (9)$$

where A is an N×N matrix with values $A_{i,i} = -K \cos(\phi_c - \Psi)$, $A_{i,i-1} = K \cos(\phi_c - \Psi)$ and zero for the remaining elements.

A necessary condition for stability is that all eigenvalues of A are non-positive. It can be shown that A has N separate eigenvalues with values of $$\lambda_i = \frac{1}{K \cos(\phi - \Psi)}[-1 + \exp(j2\pi i/N)], \quad (10)$$

where $0 \leq i < N$. Here K is positive and the term inside the bracket is less than or equal to zero when $\cos(\phi_c - \Psi \geq 0)$, such that $$\phi_c - \pi/2 \leq \Psi \leq \phi_c + \pi/2). \quad (11)$$

For values inside this boundary, $\lambda_0$ is zero and $\lambda_1$ to $\lambda_{N-1}$ are negative. As a result, the response of the system to a small perturbation diminishes for the negative eigenvalues and $\lambda_0$ can introduce an offset of $\eta_i^0$ to the phase of the $i^{th}$ core. However, from equation (8) at steady-state, all values of $\eta_i^0$ are equal and replacing this equal offset into equation (4) results in $\eta_i^0 = 0$ for all cores. Consequently, the coupled system is stable under the conditions set forth in equation (11).

The solutions to the system of differential equations (2) and (3) are values of $\Psi$ that satisfy equation (4). This results in $$\Psi_k = 2k\pi/N, \quad (12)$$

where k is an integer representing N different solutions. These solutions are the N possible coupling modes of the tunable signal source 10. The stable region for the $k^{th}$ coupling mode corresponding to $\Psi_k$ is found by replacing equation (12) into equation (11):

$$\Psi_k - \pi/2 \leq \phi_c \leq \Psi_k + \pi/2. \quad (13)$$

Figure 2:
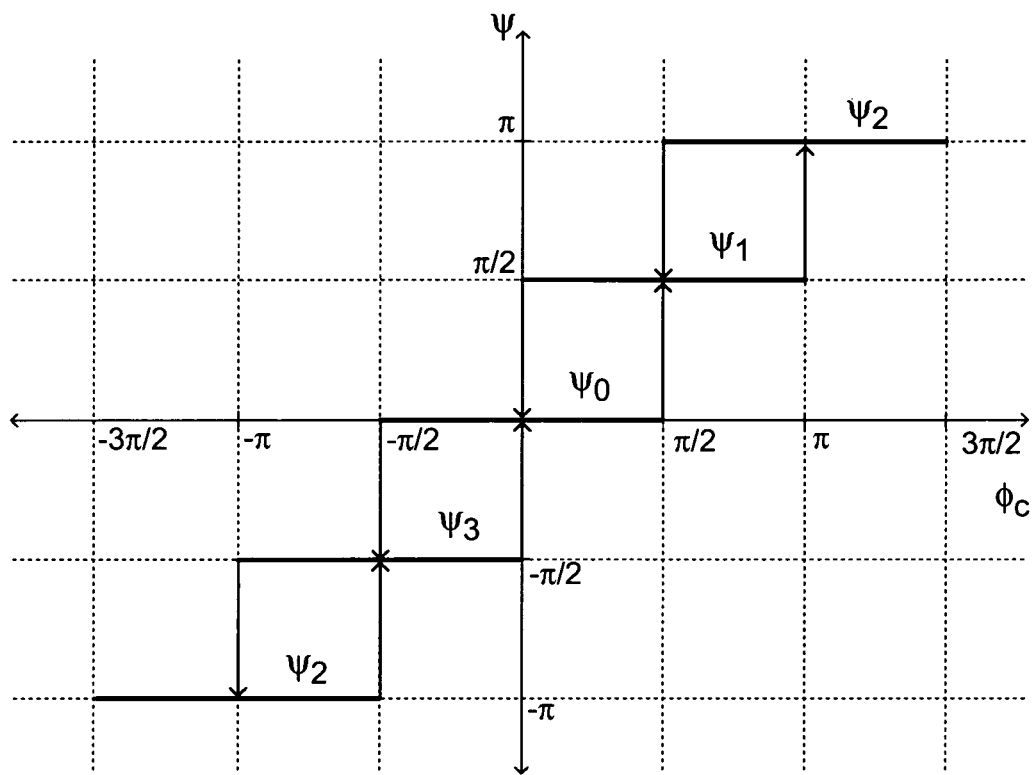
FIG. 2 is a graph depicting stable regions of a tunable signal source having four coupled oscillators.

FIG. 2 shows the stable regions as a function of the phase shift $\phi_c$. Interestingly, there is more than one stable solution for a given phase shift and depending on the initial conditions, the system settles to one of the modes. However, as long as the system is in a particular mode that satisfies equation (13) it will remain in that mode.

Figure 3:
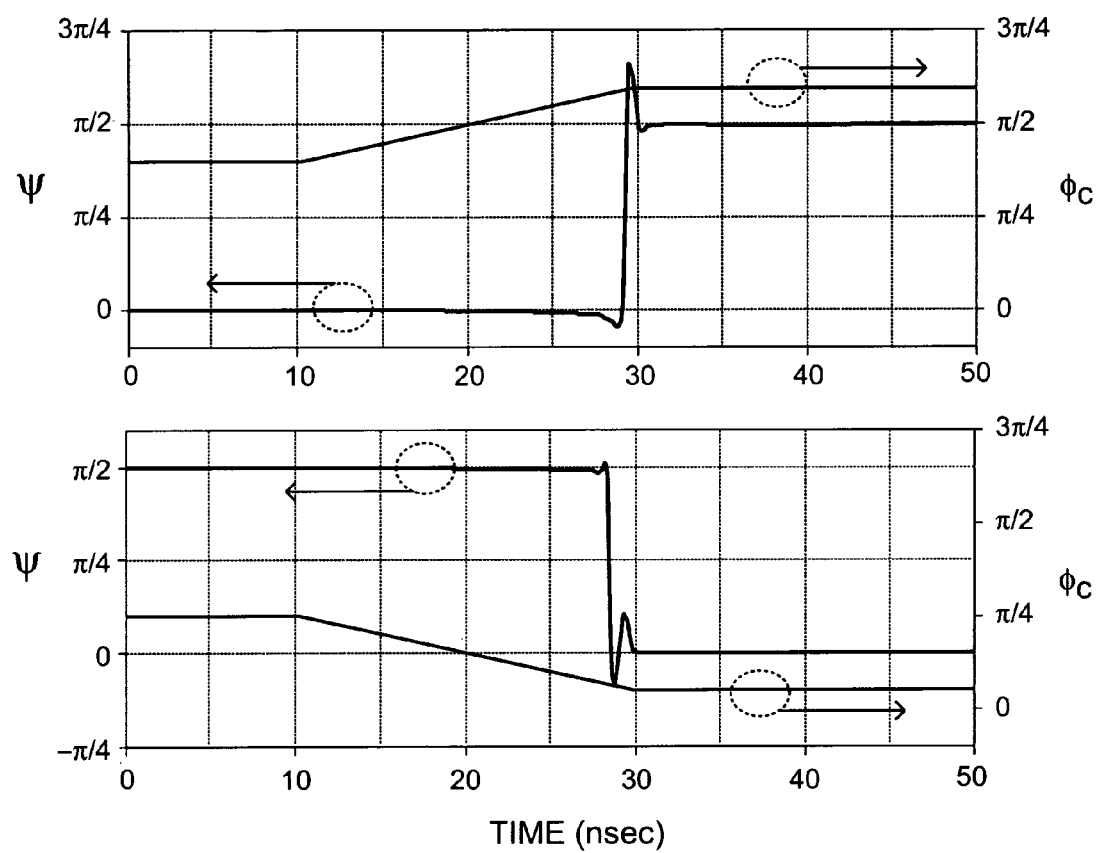
FIG. 3 is a graph depicting mode transitions for the tunable signal source of FIG. 2, with the top graph section showing a transition from φ=0 to π/2 and with the bottom graph section showing a transition from φ=π/2 to φ=0.

If the phase shift is changed beyond the stable conditions of the current mode, the tunable signal source 10 (FIG. 1) becomes unstable and moves out of this mode toward a stable mode. The transition from one mode to the other mode can be described by the general non-linear differential equation (2). Using the theory of nonlinear dynamic systems, it can be shown that the system will settle to the next state as depicted in the diagram of FIG. 2. This means that for a stable solution at $\Psi_k$, increasing $\phi_c$ eventually moves the system into $\Psi_{k+1}$, which is the next solution in the state-space where the system will arrive. Similarly, reducing $\phi_c$ moves the system into $\Psi_{k-1}$. During this transition the phase differences $\psi_i$ gradually increases (or decreases) and finally settles to the next stable mode. This behavior can be seen in FIG. 3 for the tunable signal source 10 having the four coupled oscillators cores 12 through 18. A small step in $\phi_c$ moves the system one step up to the next mode or one step down to the prior mode.

A useful feature of the actively coupled oscillator scheme is its ability to deliberately select any desired mode. As shown in FIG. 2 for a given $\phi_c$, the tunable signal source 10 (FIG. 1) can settle to one out of a few modes depending on the initial conditions. However, by changing $\phi_c$ in a deterministic way, a particular mode can be selected. After choosing this mode, the inherent hysteresis in the system will keep the system in the selected mode as long as the stability conditions are satisfied. This is in contrast to quadrature oscillators where a phase uncertainty is inherent to the system. We can consider the quadrature oscillator a special case of a coupled system for N=2, resulting in two stable modes at $\Psi=\pi/2$ and $\Psi=-\pi/2$. Without the tunable phase shifters of the coupling blocks 20 (FIG. 1) for $\phi_c=0$, the tunable signal source 10 randomly chooses either of the coupling modes resulting in ambiguity in the locking frequency.

Frequency Tuning

When the coupled oscillators are locked together at the $k^{th}$ coupling node, the angular frequency for each of the oscillator cores 12 through 18 (FIG. 1) can be derived. By substituting $\Psi_k = \phi_i - \phi_{i-1}$ into equation (2) an equation $$\omega = \omega_0 + K \sin(\phi_c - \Psi_k), \quad (14)$$

is established where $\omega$ is the resulting frequency of each of the oscillator cores 12 through 18. Note that from equation (13), $\phi_c-\Psi_k$ is always between $-\pi/2$ and $\pi/2$, in the stable region of any given coupling mode. By substituting for K, the maximum frequency tuning range is equal to $$\frac{\Delta\omega}{\omega_0} = \frac{1}{Q} \cdot \frac{I_{inj}}{I_{core}}, \quad (15)$$

where $\Delta\omega$ is the difference between the resulting frequency of the system for values of $\phi_c$ equal to $-\pi/2$ and $\pi/2$.

Figure 4:
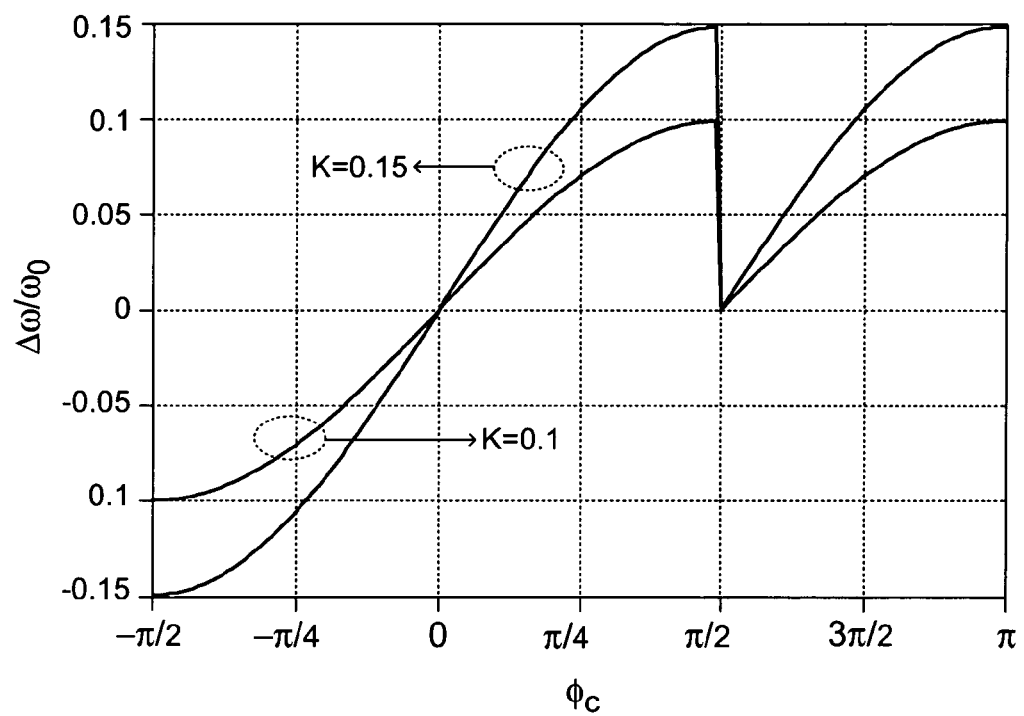
FIG. 4 is a graph of relative frequency as a function of $\phi_c$ for two values of K that have jumps in output frequency corresponding to transitions in coupling mode from Ψ=0 to Ψ=π/2.

FIG. 4 is a graph of relative frequency as a function of $\phi_c$ for two values of K that have jumps in output frequency corresponding to transitions in coupling mode from $\Psi=0$ to $\Psi=\pi/2$. The frequency tuning range can be increased by increasing the coupling factor K. Since reducing Q is not desirable for the purposes of harmonic power generation and low phase-noise, the best way to increase the tuning range is by increasing $I_{inj}$. When the amount of phase shift exceeds the stability limit of the operating mode, the coupling mode changes to the next mode resulting in an abrupt step in the output frequency as shown in FIG. 4.

Terahertz Harmonic VCO

This disclosure exploits the above described frequency tuning concept of the actively coupled oscillator cores structure for generation of high power and tunable signal sources around 300 GHz. In order to generate power above the transistor $f_{max}$, harmonic generation should be employed. The generated harmonic power should be maximized and optimally delivered to the output node. Related art attempts have been able to produce >100 µW of output power on silicon at sub-mm-wave frequencies by optimizing the device embedding for efficient generation and delivery of the harmonic power to the load. For such a design, a reasonable quality factor Q is required in the signal path which is only possible by avoiding the use of varactors. This limits the oscillator to a single frequency. The disclosed structure provides an effective method to tune the frequency while maintaining high output power.

In a preferred embodiment, each of the oscillator cores 12 through 18 (FIG. 1) is configured to generate a relative high power at a harmonic of the fundamental frequency. The oscillator cores 12 through 18 are also coupled so that the generated powers from the oscillator cores 12 through 18 are combined and delivered to a load (not shown). In addition to harmonic generation, the plurality of coupling blocks 20 performs other tasks. For example, the coupling dynamic determines the coupling mode and in a given mode the coupling dynamic further controls the operating frequency of the oscillator cores 12 through 18. The coupling blocks 20 include tunable phase shifters that operate at the fundamental frequency and are buffered from the oscillator cores 12 through 18. As a result, the tasks of power generation and frequency tuning are separated, thereby allowing the tunable signal source 10 to source a relatively high power terahertz signal.

Oscillator Design

For a given target frequency at a given technology, the first design step is to find the best harmonic of the fundamental frequency to use as the output frequency. The advantage of using a higher harmonic number is that the fundamental frequency is lower and generates larger amplitudes resulting in more non-linearity. However, the power generated at higher harmonics is significantly smaller than lower harmonics. On the other hand, using lower harmonic numbers forces the fundamental frequency to become close to $f_{max}$, resulting in a low fundamental power to begin with. As a result, there is a trade-off in choosing the harmonic number and the lowest harmonic number is not necessarily the best choice.

Figure 5:
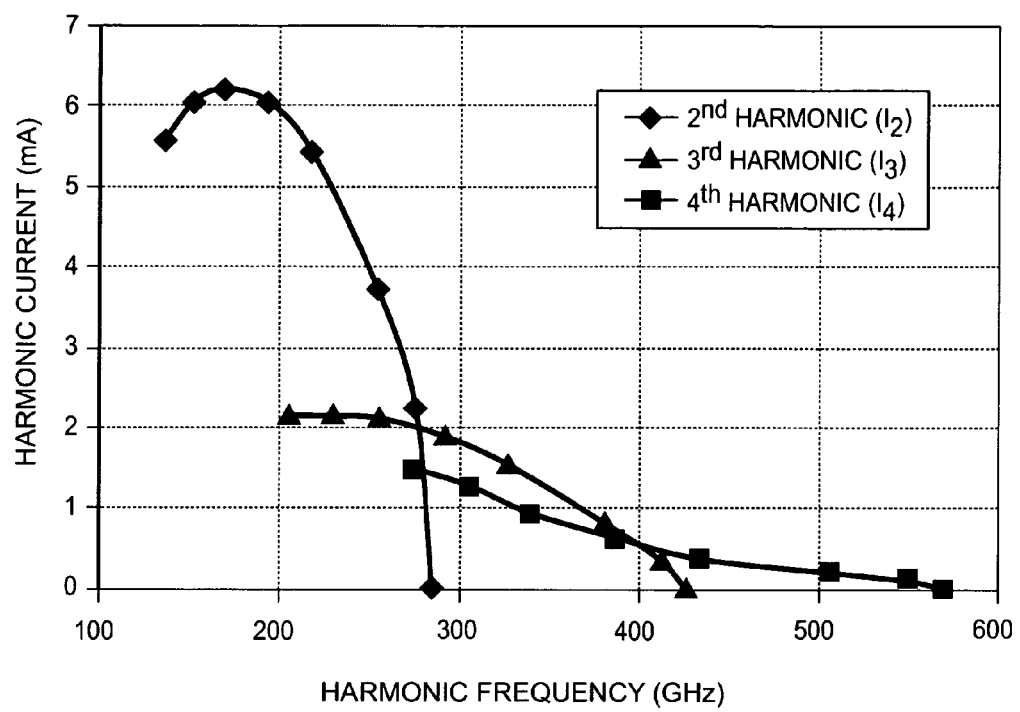
FIG. 5 is a graph of simulated harmonic current generated at the drain of a 65 nm complementary metal oxide semiconductor (CMOS) transistor in a cross-coupled oscillator configuration.

In one embodiment, a target fourth harmonic frequency of 300 GHz is chosen for the highest power generation. The simulated $f_{max}$ of this process is around 200 GHz and as a result, using the second harmonic results in a fundamental frequency of 150 GHz which is too close to $f_{max}$ for the desired fourth harmonic frequency to be generated. FIG. 5 is a graph of simulated harmonic current generated at the drain of a 65 nm complementary metal oxide semiconductor (CMOS) transistor in a cross-coupled oscillator configuration. As shown in FIG. 5, the fourth harmonic generates a higher harmonic current compared to the second harmonic. This is mainly due to the larger nonlinearity produced by a fundamental frequency around 75 GHz. As simulations indicate, the third harmonic creates slightly higher levels of harmonic current. However, in this embodiment even harmonics are favored because of the resulting symmetry in implementation of the coupled system. By using the fourth harmonic in this embodiment, cross-coupled LC oscillators are usable as the oscillator type for the oscillator cores 12 through 18.

Figure 6:
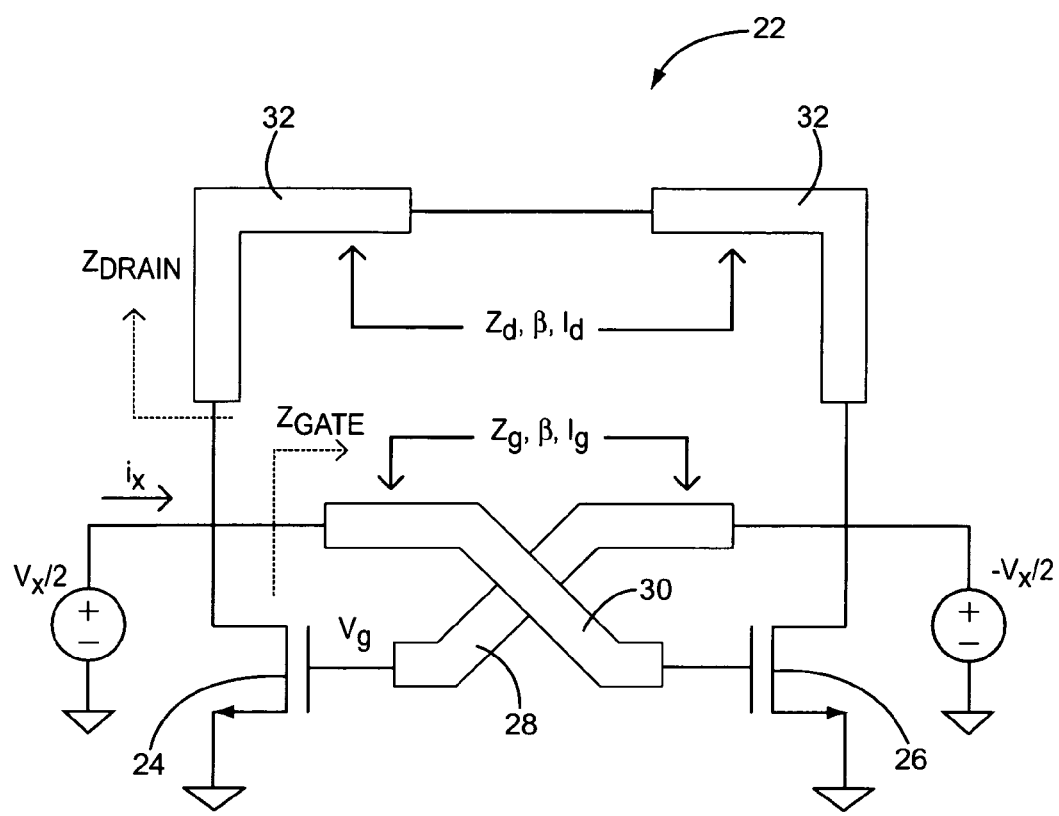
FIG. 6 is a schematic of a modified cross-coupled oscillator configuration and equivalent circuit for fundamental frequency operation.

The structure of an LC resonator is configurable to maximize performance of the circuit both at the fundamental and the fourth harmonic. FIG. 6 is a schematic of a modified cross-coupled oscillator structure 22 and equivalent circuit for fundamental frequency operation. As shown in FIG. 6, the cross-coupled structure 22 is extended into a more general resonator. The fundamental frequency is determined by the resonance frequency of a network making up the cross-coupled structure 22. Moreover, at the fourth harmonic the cross-coupled structure 22 delivers maximum power from a first transistor 24 and a second transistor 26 to a load. Both the fundamental frequency and maximum harmonic power delivery can be simultaneously achieved by adding impedance to the gate of the first transistor 24 and a second transistor 26. For practical purposes, a first transmission line 28 and a second transmission line 30 are employed to control the impedances of the gate of the first transistor 24 and the gate of the second transistor 26, respectively. A third transmission line 32 and a fourth transmission line 34 are employed to control the impedances of the drain of the first transistor 24 and the drain of the second transistor 26, respectively. This disclosure assumes that the first transmission line 28, the second transmission line 30, the third transmission line 32, and the fourth transmission line 34 have characteristic impedances of $Z_g$ and $Z_d$ with lengths of $l_g$ and $l_d$, respectively. For this analysis, only transistor parameters of gate capacitance $C_g$ and transconductance $g_m$ are modeled.

To find the impedance of the resonator, the governing equation at the output node is rewritten. By applying a differential voltage source $v_x$, the resulting current $i_x$ is equal to:

$$i_x = g_m v_g + \frac{v_x}{2Z_{gate}} + \frac{v_x}{2Z_{drain}}, \quad (16)$$

where $v_g$ is the voltage at the gate, and $Z_{gate}$ and $Z_{drain}$ are the impedances looking into the gate and drain lines respectively. By calculating $Z_{gate}$, $Z_{drain}$ and $v_g$ using transmission line analysis, the resonator transconductance, $G_m$ can be derived:

$$G_m = \frac{i_x}{v_x} = \quad (17)$$

$$-\frac{g_m}{2} \cdot \frac{1+\Gamma}{e^{j\beta l_g} + \Gamma e^{-j\beta l_g}} + \frac{1}{2Z_g} \cdot \frac{1 - \Gamma e^{-j2\beta l_g}}{1 + \Gamma e^{-j2\beta l_g}} + \frac{1}{2Z_d} \cdot \frac{1 + e^{-j2\beta l_d}}{1 - e^{-j2\beta l_d}},$$

where $\Gamma$ is the reflection coefficient at the gate of the transistor and $\beta$ is the propagation constant. While this analysis does not address the effect of loss in the lines and the transistor, it is helpful for finding the resonance frequency. In this design, $l_g$ and $l_d$ are significantly smaller than the wavelength at the fundamental frequency of 75 GHz, or equivalently $\beta l_g \ll 1$ and $\beta l_d \ll 1$. By applying this approximation and substituting for $\Gamma$, equation (17) can be approximated as $$G_m \simeq -\frac{g_m}{2} + \frac{jC_g\omega}{2} + \frac{1}{2Z_d \cdot j\beta l_d}. \quad (18)$$

This implies that in the proposed oscillator, the gate transmission line has a minimal effect on the fundamental frequency. This frequency, $\omega_0$ can be calculated by setting the imaginary part of $G_m$ equal to zero:

$$\omega_0 = \sqrt{\frac{v_p}{C_g Z_d l_d}}, \quad (19)$$

where $v_p = \omega/\beta$ is the propagation velocity of the wave in silicon dioxide.

Harmonic Power Generation

Figure 7:
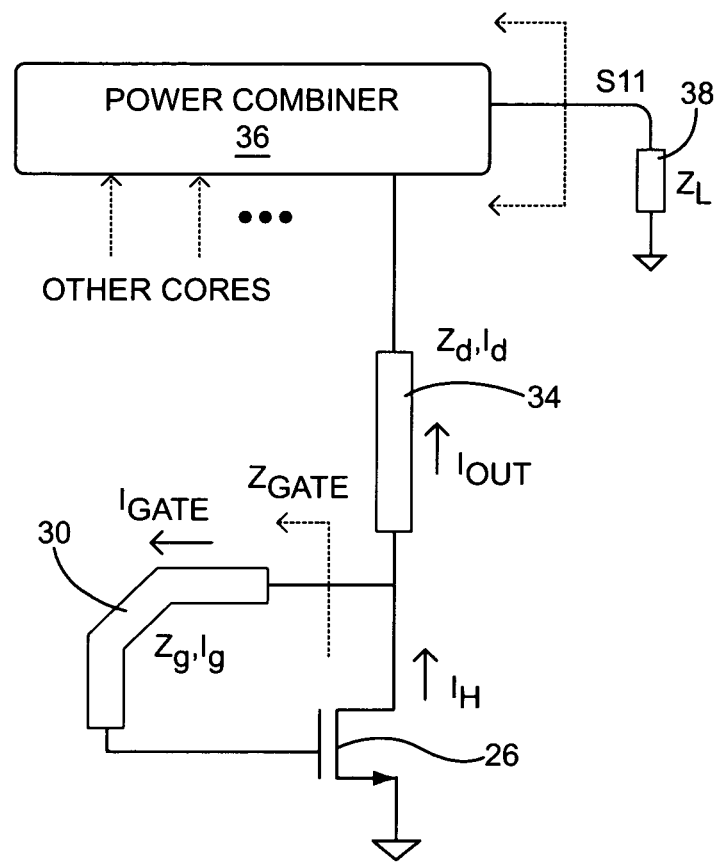
FIG. 7 is a half circuit equivalent of an oscillator core operating at a fourth harmonic.

At the fourth harmonic, the cross-coupled structure 22 operates in common mode, resulting in a half circuit equivalent shown in FIG. 7. Device non-linearity generates a harmonic current $I_h$ at the drain of the second transistor 26. A voltage reflection coefficient S11 is shown looking into a power combiner 36. For the highest power delivery this current has to be efficiently delivered to a load 38.

In the general case shown in FIG. 7, $I_h$ is divided into two branches, $I_{out}$ which proceeds to the output load and $I_{gate}$ which returns to the gate of the transistor. To maximize the output power, $I_h$ should flow to the output node, which means $Z_{gate}$ has to be maximum at the fourth harmonic to minimize $I_{gate}$. By employing the oscillator design analysis, the gate impedance is equal to:

$$Z_{gate} = \frac{1}{2Z_g} \cdot \frac{1 - \Gamma e^{-j2\beta l_g}}{1 + \Gamma e^{-j2\beta l_g}}. \quad (20)$$

$Z_{gate}$ is maximum at its resonance frequency. By proper design of $l_g$ and $Z_g$, this resonance can lie at the fourth harmonic.

An output of each of the oscillator cores 12 through 18 is connected to the power combiner 36. To design a VCO at the fourth harmonic, the coupling mode is set for $\Psi = \pi/2$. In this mode, the second harmonic from the oscillator cores 12 through 18 cancel out at the output node 40. The first and third harmonics are also canceled because of the differential structure. As a result, the lowest harmonic frequency at the output is the fourth harmonic. Furthermore, for optimal power combining, the drain impedances of the transistors has to be power matched. Pad and metallization layers 42 provide isolation between the oscillator cores 12 through 18.

Figure 8:
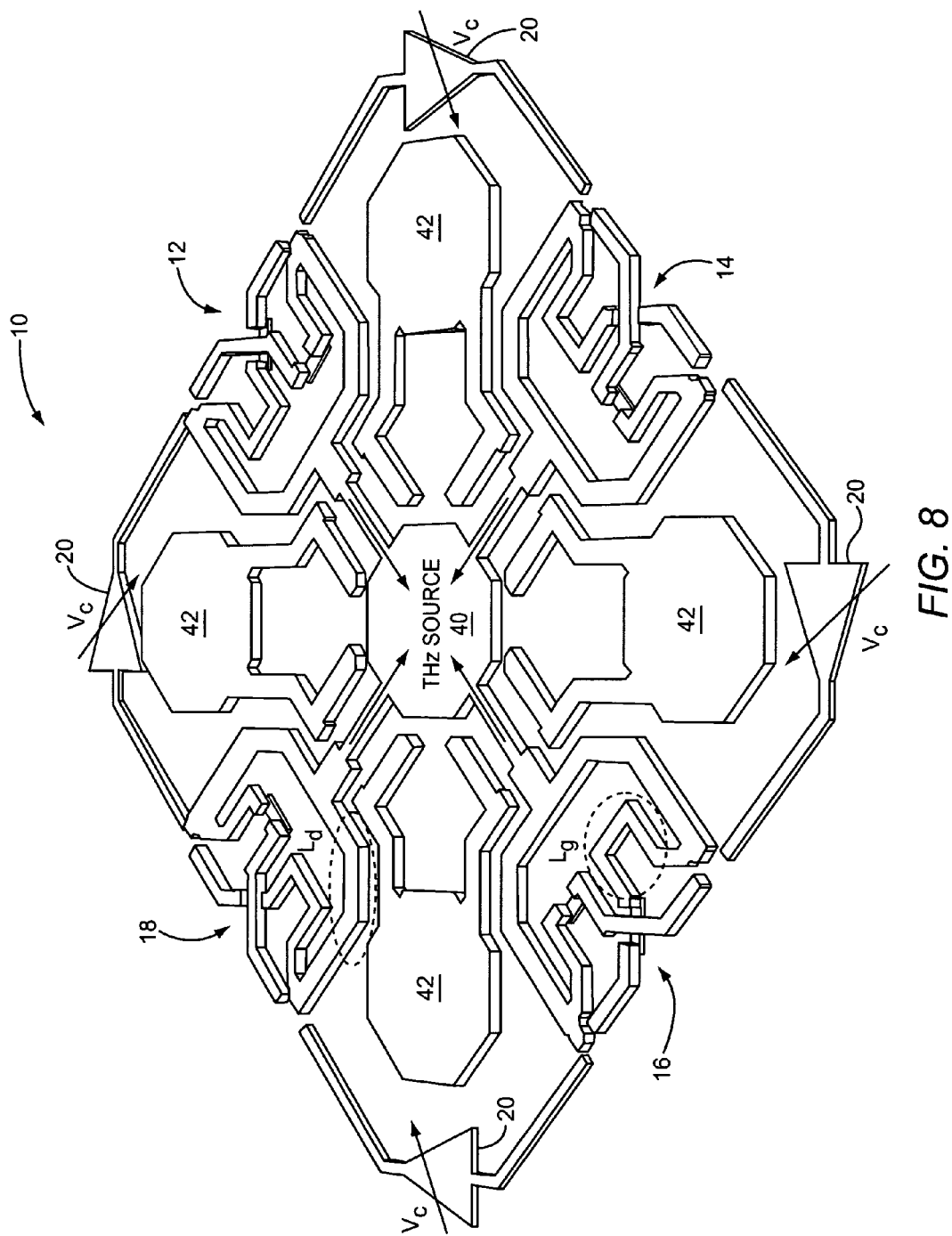
FIG. 8 is a three dimensional schematic of one embodiment of a tunable signal source with four coupled oscillator cores configured as a voltage controlled oscillator (VCO).
Figure 9:
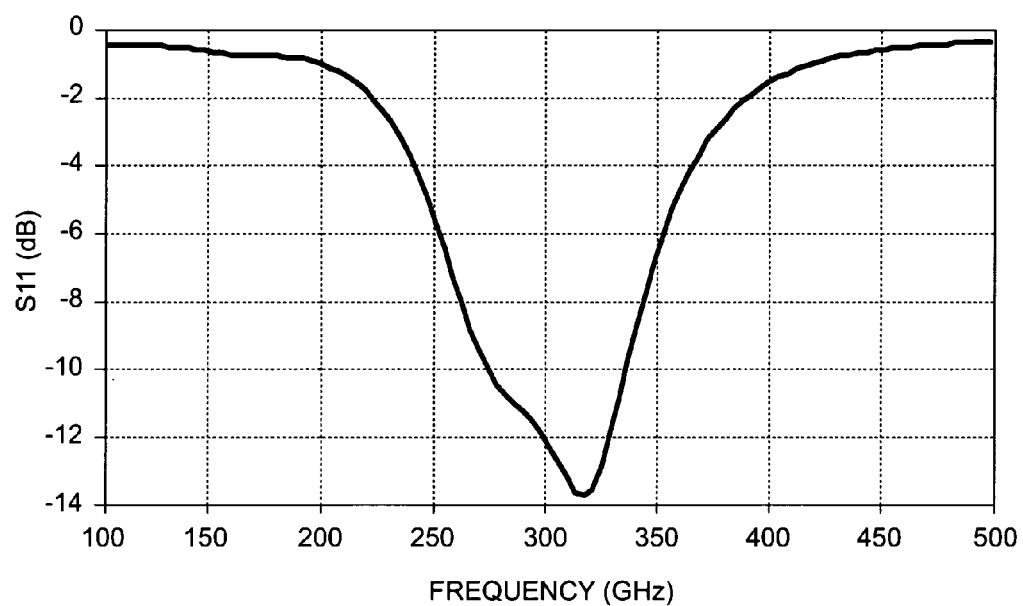
FIG. 9 is a graph of an input port voltage reflection coefficient S11 versus frequency.
Figure 10:
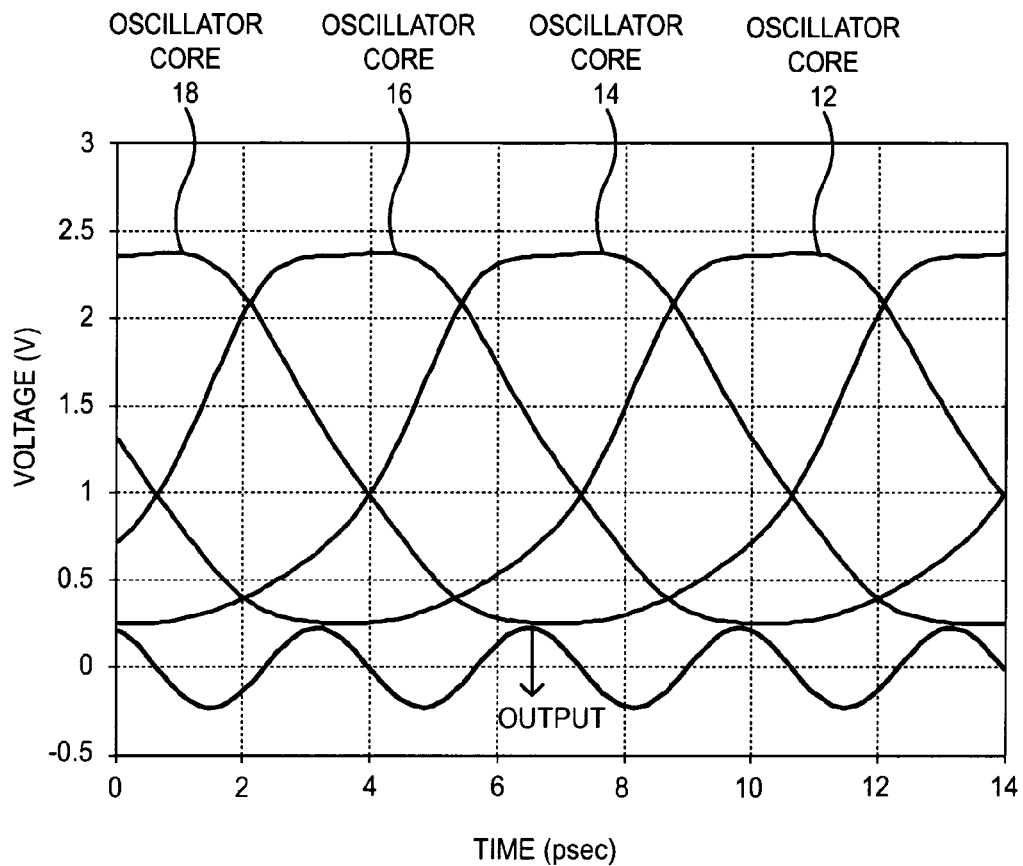
FIG. 10 is a graph depicting simulated waveforms for the oscillator cores and output node of the embodiment of FIG. 8 while oscillating at the fourth harmonic.

FIG. 8 is a three dimensional schematic of one embodiment of the tunable signal source 10 with the coupled oscillator cores 12 through 18 configured as a voltage controlled oscillator (VCO). The drain lines are first connected together and subsequently connected to the load. The impedance and length of the lines are designed for matching at the fourth harmonic. FIG. 9 is a graph of the input port voltage reflection coefficient S11 versus frequency. Notice that the input port voltage reflection coefficient S11 reaches a minimum between 300 GHz and 350 GHz. FIG. 10 shows the waveforms of the oscillator cores 12 through 18 at the fundamental frequency and the output node at the fourth harmonic. Notice that the peak-to-peak amplitude of the output of the tunable signal source 10 is around 0.5V. The time scale for the graph of FIG. 10 is picoseconds (psec).

Coupling

Figure 11:
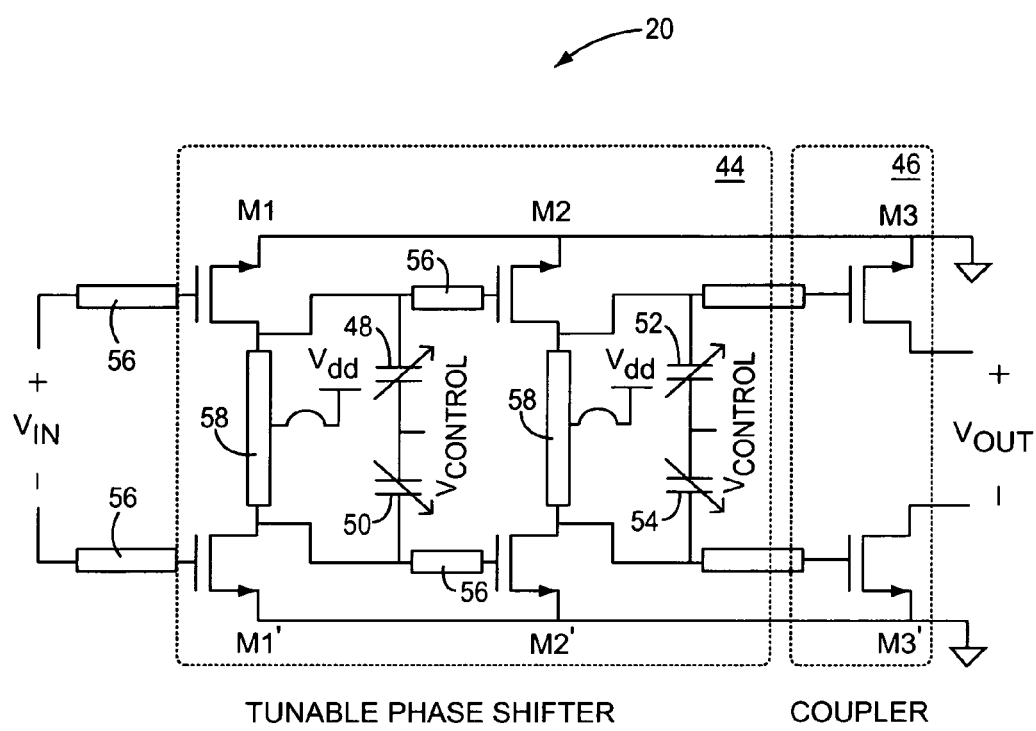
FIG. 11 is a schematic showing details of an exemplary one of the plurality of coupling blocks, which includes a tunable phase shifter followed by a coupler for coupling to the input of an adjacent oscillator core (not shown).

FIG. 11 is a schematic showing details of an exemplary one of the plurality of coupling blocks 20 (FIG. 1), which includes a tunable phase shifter 44 followed by a coupler 46 for coupling to the input of an adjacent oscillator core (not shown). Each of the coupling blocks 20 uses the tunable phase shifter 44 to control the frequency and the coupling mode for the tunable signal source 10. Moreover, each of the coupling blocks 20 are also buffered from the oscillator cores 12 through 18 to minimize the power loss due to coupling. Each of the coupling blocks 20 includes three stages. The first two stages include transistors M1 and M1' along with transistors M2 and M2' that act as variable phase shifters and a third stage, which is coupler 46 includes transistors M3 and M3' that acts as a buffer prior to connecting the tunable phase shifter 44 to the next core oscillator. A fully differential scheme is implemented and the supply of the phase shifters is provided off-chip through the virtual ground. The transistors M1 and M1' along with M2 and M2' make up two resonating amplifiers. The resonance frequency is designed to be close to the fundamental frequency of the core oscillators 12 through 18. Varactors 48, 50, 52, and 54 are usable to tune the resonance frequency and subsequently change the overall phase shift. Gate transmission lines 56 are used for impedance matching from one stage to the next. Drain transmission lines 58 are used to provide a desired drain impedance.

This disclosure considers the tunable phase shifter 44 at frequencies close to the resonance frequency. The total phase shift of the tunable phase shifter 44 is $$\phi_c(\omega) = \phi_c^0 + \frac{4Q_c}{\omega_r} \cdot (\omega - \omega_r), \quad (21)$$

where $\omega_r$ and $Q_c$ are the center frequency and quality factor Q of each varactor 48 through 54, respectively. The variable $\phi_c^0$ represents the phase shift at $\omega = \omega_r$ from the output of the prior core to the injecting current from M3 to the next core. The total phase shift $\phi_c$ includes the variable phase shifts from the first the two stages M1, M2 and the fixed phase shift from M3.

In order to find the resulting frequency equation (21) is placed into the coupling equation in equation (14):

$$\omega = \omega_0 + K\sin\left(\phi_c^0 + \frac{4Q_c}{\omega_r} \cdot (\omega - \omega_r - \Psi_k)\right). \quad (22)$$

Finding the exact tuning range requires numerical simulation. However, it is instructive to find the trend predicted by equation (22) by finding the change in the oscillating frequency with respect to change in $\omega_r$:

$$\frac{d\omega}{d\omega_r} = \frac{-\frac{4KQ_c}{\omega_r^2}\omega\cos\left(\phi_c^0 - \Psi_k + \frac{4Q_c}{\omega_r}(\omega - \omega_r)\right)}{1 - \frac{4KQ_c}{\omega_r}\cos\left(\phi_c^0 - \Psi_k + \frac{4Q_c}{\omega_r}(\omega - \omega_r)\right)} \quad (23)$$

Figure 12:
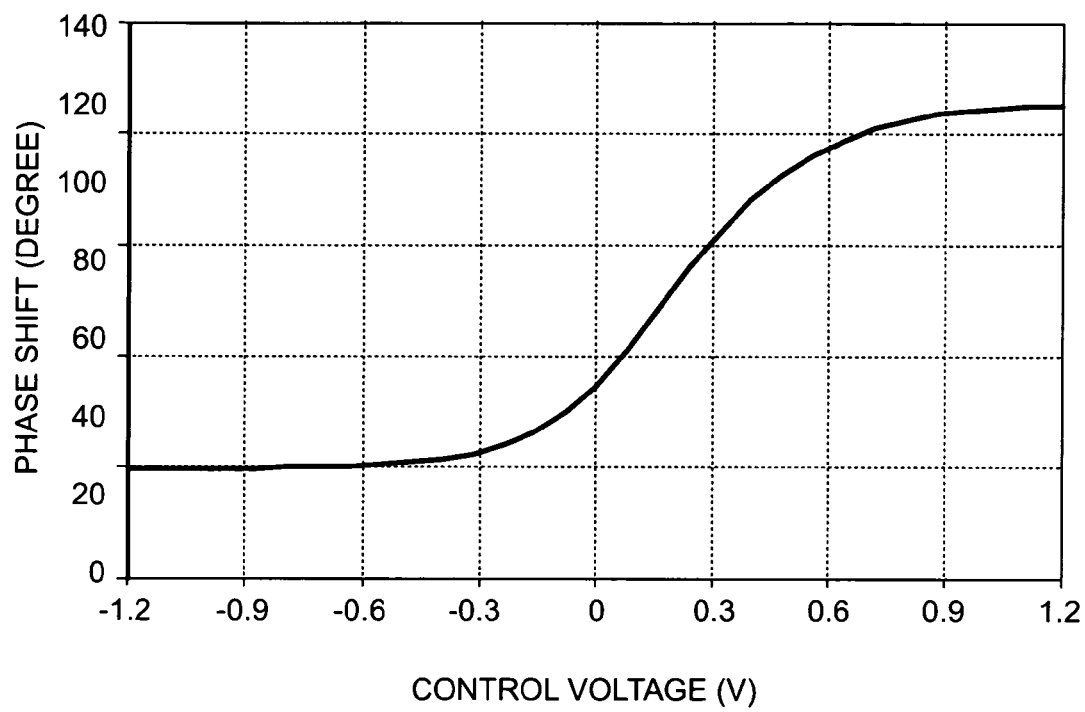
FIG. 12 is a graph of a simulated phase shift of a coupling block as a function of a control voltage applied across a varactor.
Figure 13:
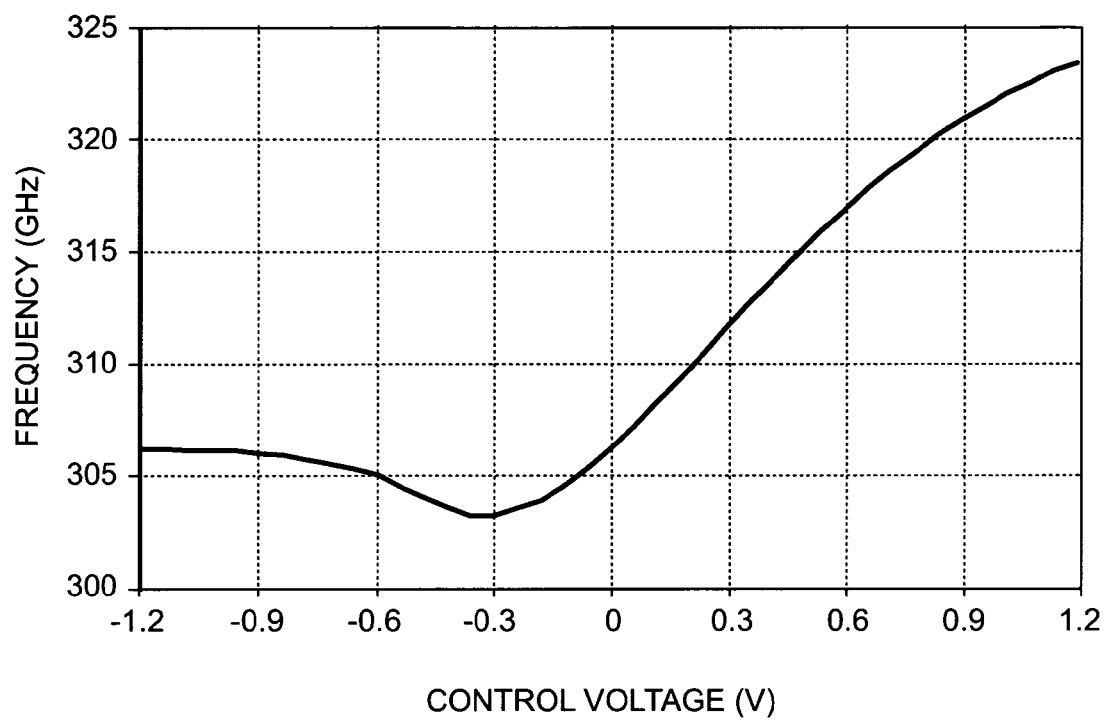
FIG. 13 is a graph of simulated frequency variation as a function of the control voltage.

The tuning method is based on changing $\omega_r$ of the tunable phase shifter 44 by tuning the resonance capacitors. Interestingly, as equation (23) suggests, an optimum K exists where the slope is maximum. FIG. 12 is a graph of a simulated phase shift of a coupling block as a function of a control voltage applied across each of the varactors 48 through 54. FIG. 12 also shows a simulated phase shift for each tunable phase shifter 44 at $\omega_0$ as a function of the control voltage. By definition, $V_c$ is the DC voltage across each of the varactors 48 through 54. Since a gate of each of the varactors 48 through 54 is biased at 1.2 V, all voltages are positive for the entire range of $V_c$. Note that the eventual phase shift is determined by the actual frequency that is slightly different from $\omega_0$, but the behavior remains the same. In practice, K changes both with respect to the control voltage and the frequency. For an accurate picture of the frequency tuning one also has to consider the change in the gain of the coupling amplifiers. However, in this design most of the frequency tuning is achieved within the voltage range where the coupling amplitude can be considered constant. FIG. 13 is a graph of simulated frequency variation as a function of the control voltage.

Implementation

Figure 14:
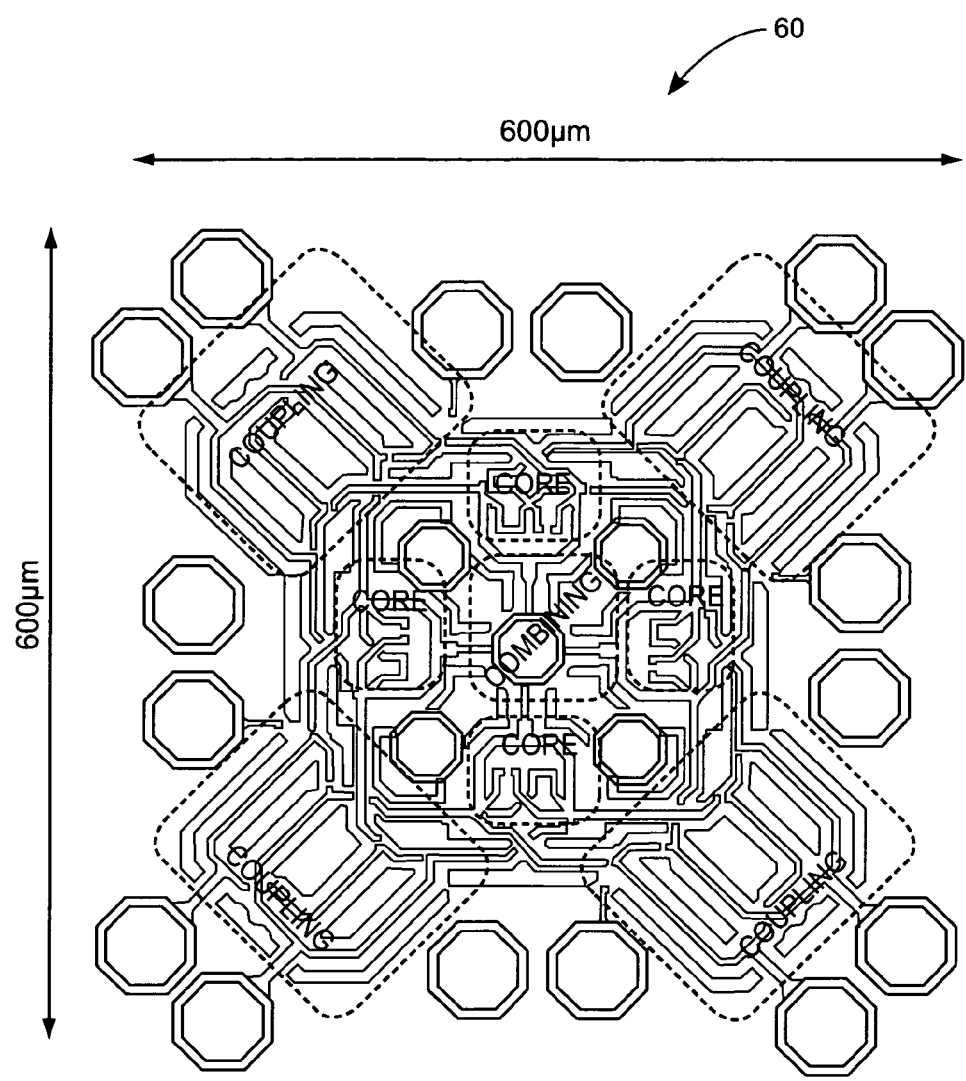
FIG. 14 is a line drawing of a photomicrograph of an integrated circuit die on which the tunable signal source is fabricated.

FIG. 14 is a line drawing of a photomicrograph of an integrated circuit die 60 on which the tunable signal source 10 (FIGS. 1 and 8) is fabricated. Moreover, in this particular embodiment, the tunable signal source 10 is implemented in a 65 nm low-power (LP) CMOS process. As shown in FIG. 14, the integrated circuit die 60 has dimensions around 600 μm by 600 μm.

Simulation

Simulation of the tunable signal source 10 is beneficial for determining component properties such as practical dimensions for the first transmission line 28, the second transmission line 30, the third transmission line 32, and the fourth transmission line 34 (FIG. 6). This is particularly important for designing the oscillator cores 12 through 18 where the matching and power combining occurs at around 300 GHz. Moreover, simulation is particularly beneficial when considering that the first transmission line 28, the second transmission line 30, the third transmission line 32, and the fourth transmission line 34 are comparable with the wavelengths of the frequencies of operation for the tunable signal source 10. Each of the oscillator cores 12 through 18 is designed based on the exemplary design methodology described so far, in which the center frequency is set by $l_d$ and $Z_d$ of the third transmission line 32 and the fourth transmission line 34 that control the drain impedances. Harmonic matching is achieved by tuning $l_g$ and $Z_g$ of the first transmission line 28, and the second transmission line 30 that control the gate impedances. Moreover, the transistors M1, M2, and M3 are RF devices with ground shielding. Ground shielding is placed under all transmission lines such as the first transmission line 28, the second transmission line 30, the third transmission line 32, and the fourth transmission line 34 by placing first and second metal layers of the integrated circuit die 60 in parallel. Because of the proximity between the first transmission line 28, the second transmission line 30, the third transmission line 32, and the fourth transmission line 34, the effect of coupling between the lines should be simulated. In order to do so, the entire metallization of the oscillator cores 12 through 18 is modeled as a 5-port device, such that four ports are connected to the gates and drains of the cross-coupled first transistor 24 and the second transistor 26 along with a fifth port connecting the output to the power combiner 36. A symmetric layout is preferred in achieving the maximum fourth harmonic generation and lower harmonic cancellation. Each of the oscillator cores 12 through 18 is shielded from the other coupling blocks 20 by using grounded metal walls.

The layout details of the passive elements are shown in FIG. 8. The coupling blocks 20 are designed to achieve equal lengths for the two differential signal paths. To achieve a fully differential scheme the inductors of the tunable phase shifter 44 are designed to be differential and their middle points are wirebonded for the DC current. The varactors 48 through 54 are buffered from the oscillator cores 12 through 18, and as a result the varactors 48 through 54 have minimal effect on the quality factor Q of the oscillator cores 12 through 18. Moreover, the varactors 48 through 54 are connected to bypass capacitors and are electrostatic discharge (ESD) protected prior to pad connecting. The tunable phase shifters 44 are designed to achieve good phase tuning and sufficient energy coupling at the same time. The transistors M1 and M1' act as front-end buffer devices. Both transistors M1 and M1' are preferably smaller than the transistors M2, M2', M3 and M3' of the following two stages. The reason a smaller size for transistors M1 and M1' is preferable is to minimize the loading effect of coupling to an injecting one of the oscillator cores 12 through 18. The power combiner 36 is designed for matching at the fourth harmonic frequency as shown in FIG. 9. Since the reactance of pad capacitance is significant at the target frequency, its effect is considered in designing a network for the power combiner 36.

Measurement

Figure 15:
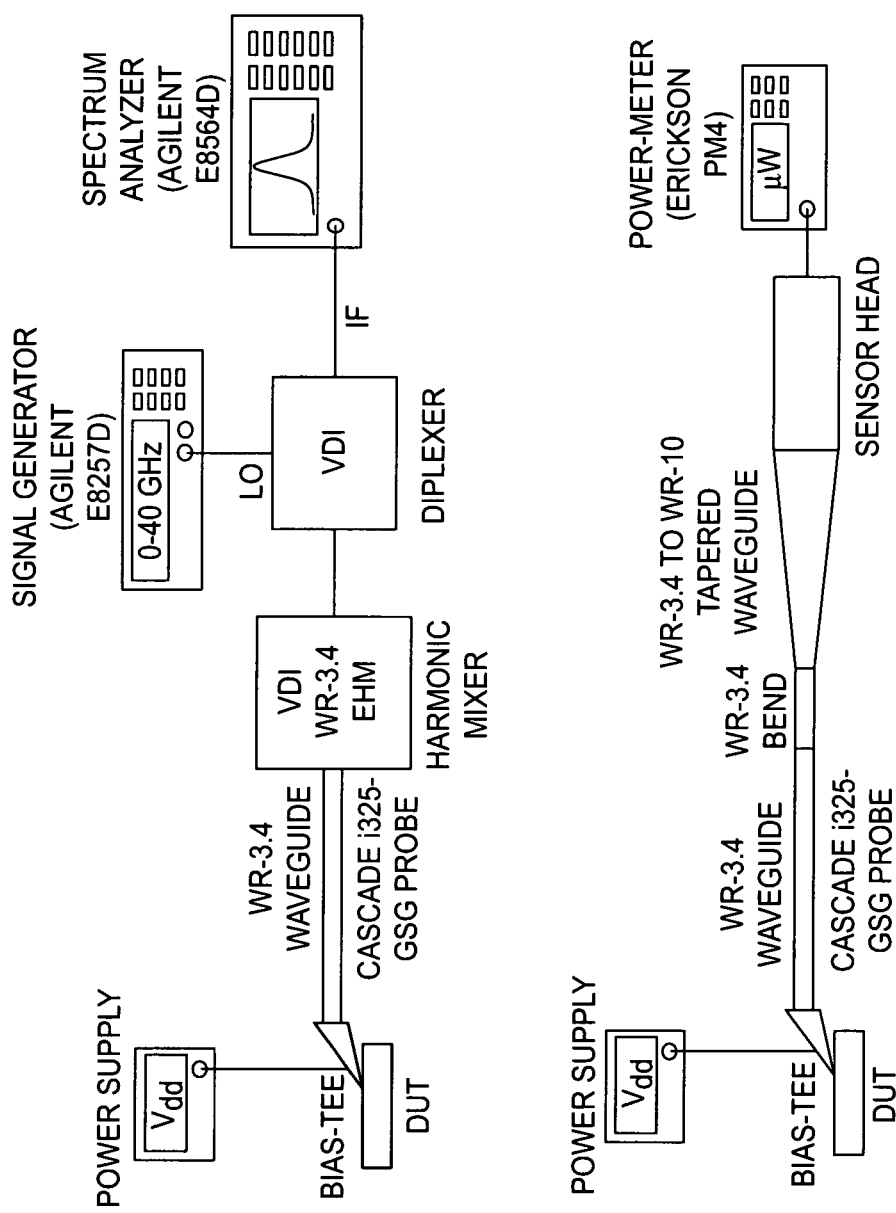
FIG. 15 is a schematic of an output frequency measurement test setup, which is depicted at the top, and an output power measurement test setup, which is depicted at the bottom.
Figure 17:
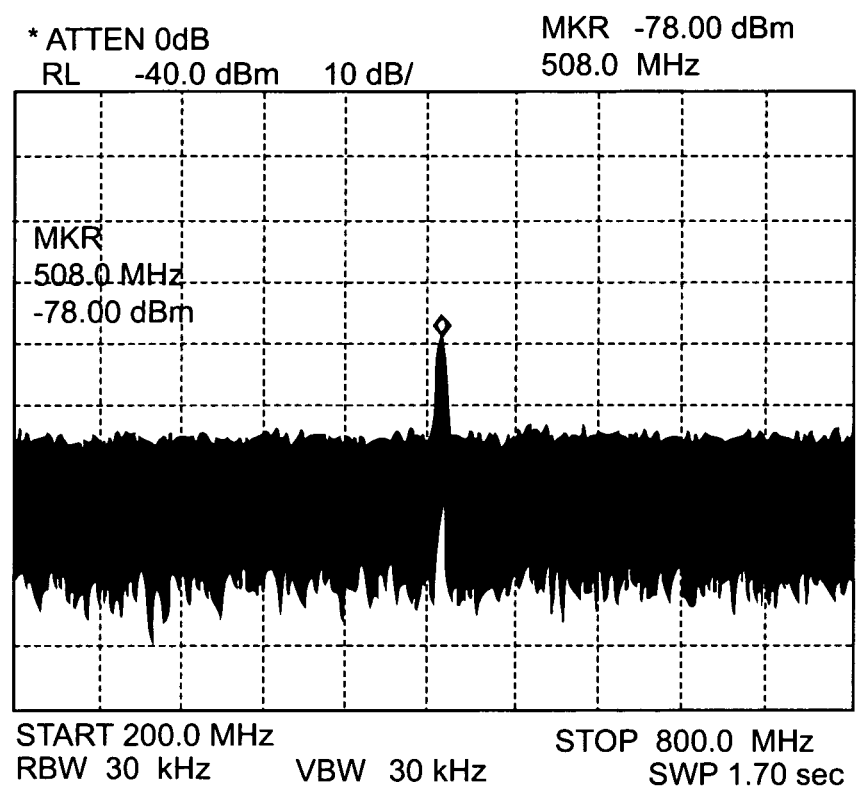
FIG. 17 is spectrum analyzer display output of a typical measured output spectrum downconverted by the 16$^{th}$ harmonic of the local oscillator (LO) used by the output frequency measurement test setup of FIG. 15.

A measurement bench is composed of two setups, the first for measuring the output frequency and the second for measuring the output power. Two test setups are shown in FIG. 15. The output of a device under test (DUT), which in this case is tunable signal source 10 (FIG. 1) is connected to a Cascade i325-GSG probe with a built-in bias tee that provides the DC current to the four oscillator cores 12 through 18. An alternative to using a bias tee is to provide the DC current using wirebonds and use a quarter wavelength stub to connect the supply to the output node. For the frequency measurement setup, a Virginia Diodes Inc. (VDI) WR-3.4 even harmonic mixer (EHM) is used for down-converting the sub-mm-wave signal. A local oscillator (LO) is set so that an intermediate frequency (IF) is generated below 1 GHz. In order to calculate the output frequency, the harmonic number of the LO is found and then multiplied with the RF signal. This is done by changing LO and finding the ratio between the frequency change in IF with respect to the frequency change in LO. FIG. 17 shows the IF spectrum from the 16th harmonic of the LO.

Figure 16:
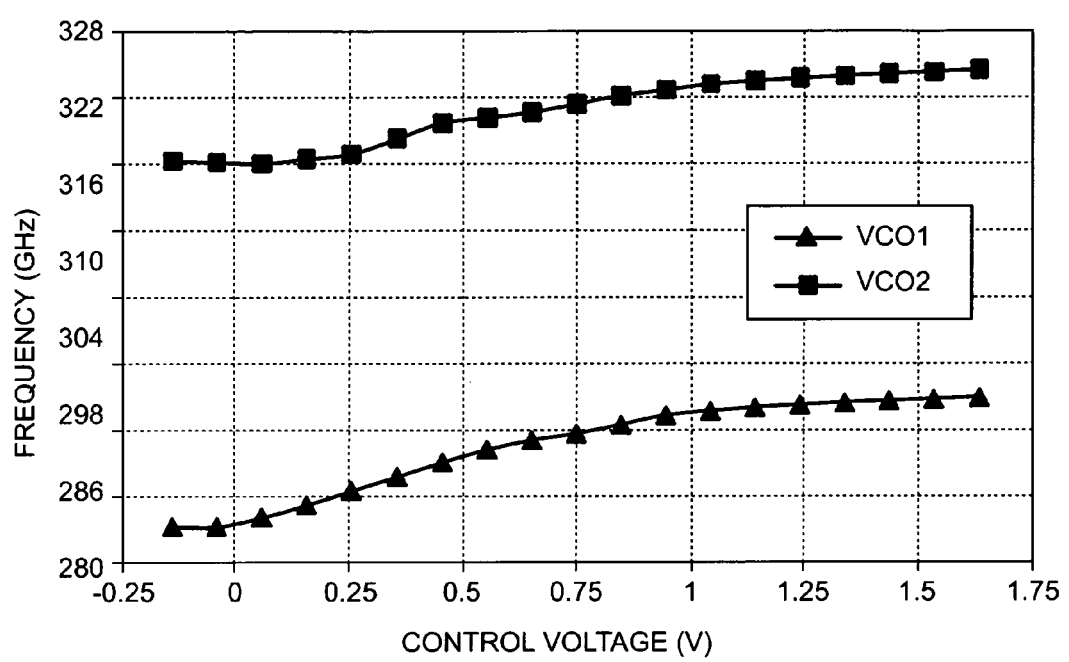
FIG. 16 is a graph depicting measured output frequency versus control voltage for two VCOs built in accordance with the present disclosure.

By selecting two different values for $l_d$, two versions of the tunable signal source 10 are designed at two different center frequencies. The first version of the tunable signal source 10 is referred to as VCO1 and the second version of the tunable signal source is referred to as VCO2. FIG. 16 shows the measured output frequency for VCO1 and VCO2 as a function of the control voltage. VCO1 has about 13 GHz of tuning range around 290 GHz while VCO2 has a tuning range of about 8.4 GHz around 320 GHz. VCO2 has a lower tuning range because the coupling circuit for both versions is the same, while the tuning range of the tunable phase shifter 44 (FIG. 11) is better at 290 GHz. As shown in FIG. 12, the tuning range of the tunable phase shifter 44 is less than 180 degrees, thus, the frequency tuning range can be further increased by adding another stage to the tunable phase shifter 44.

Figure 18:
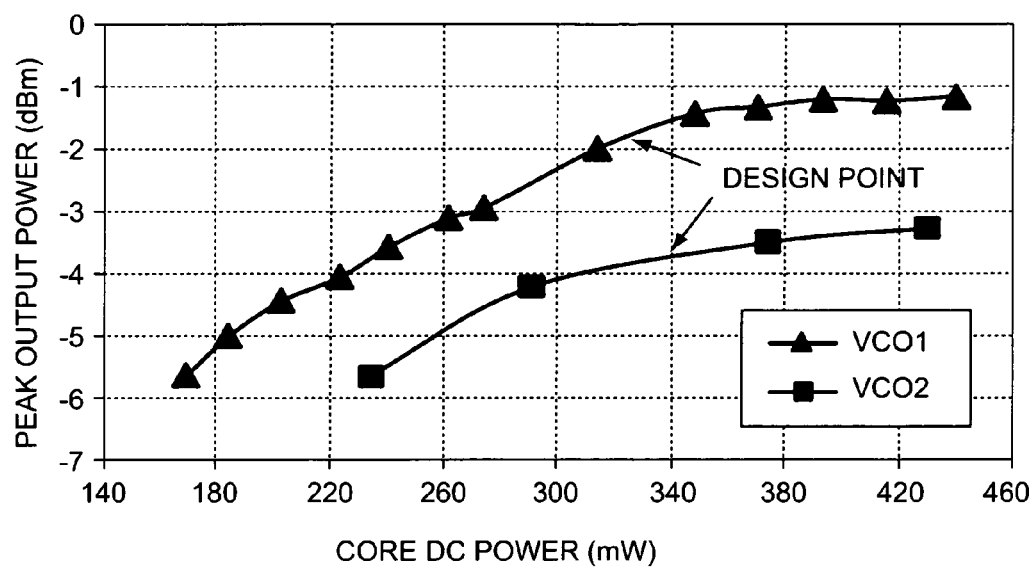
FIG. 18 is a graph of measured peak output power versus direct current (DC) power.
Figure 19:
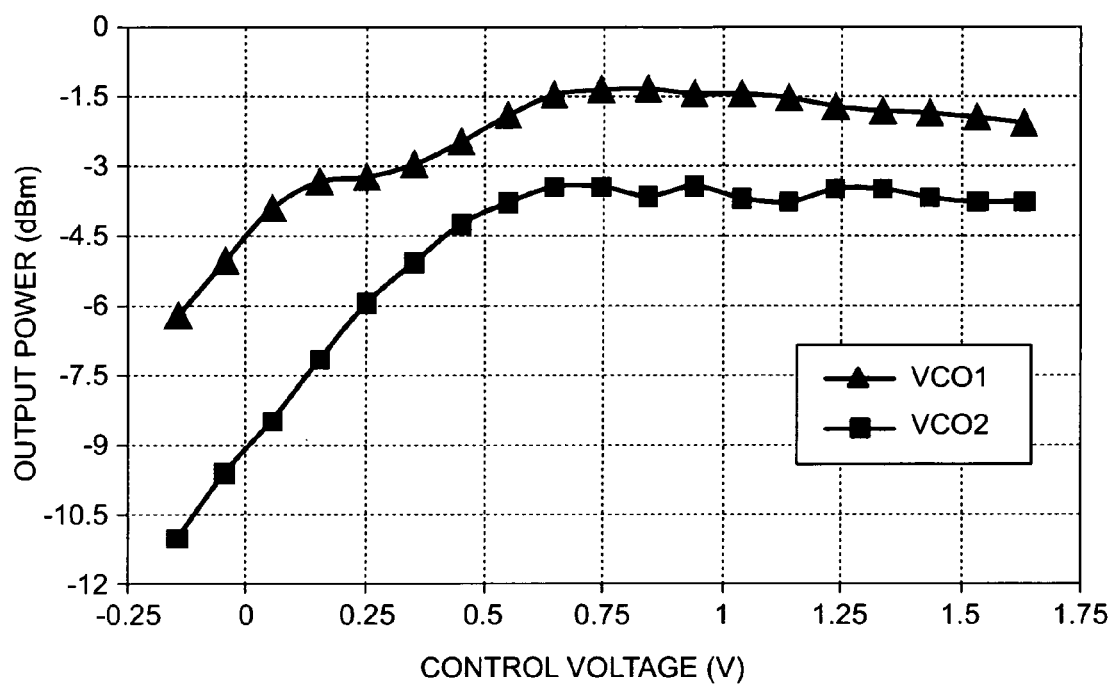
FIG. 19 is a graph of measured output power for the design points indicated in FIG. 18.

For output power measurement, a wide-band Erikson PM4 power meter is employed. As shown in FIG. 15, a probe is connected to a 90 degree bend which is followed by a WR-3.4 to WR-10 tapered line. The loss of all the components is calibrated using a 500 GHz network analyzer. FIG. 18 shows the peak output power as a function of the input DC power to the oscillator cores. The design point for both chips is chosen at the point with the best DC to RF power ratio. FIG. 19 shows the output power as a function of the control voltage. The variation in the output power is mostly due to variation in the gain of the tunable phase shifters 44 for different control voltages. Although the oscillator systematically cancels all the lower harmonics, mismatch between oscillator cores can lead to some undesired harmonic leakage to the output node. However, the amount of leaked output power is relatively small in comparison to the main harmonic. Any leaked power is largely filtered out by the output matching network and the high-pass nature of the rectangular waveguides. This is verified by observing the output spectrum of the lower harmonics which are is at least 15 dB lower than the fourth harmonic.

For the first tunable signal source the peak output power is −1.2 dBm and the tuning range is 4.5% around 290 GHz. The second tunable signal source has a peak output power of −3.3 dBm with a 2.6% tuning range around 320 GHz. The measured phase noises of the 290 GHz and 320 GHz sources at the 1 MHz offset frequency are −78 dBc/Hz and −77 dBc/Hz, respectively. Each oscillator core consumes 81 mW from a 1.3 V supply voltage and the power consumption of each coupling block is 31 mW from a 1.1 V supply voltage. Because of the large DC current flowing into the oscillator cores, the supply voltage of the oscillator cores is slightly higher than the nominal value of 1.2V in order to compensate the voltage drop from a pad to the drain of the transistors.

Prior to this disclosure, the highest output powers provided by CMOS oscillators were achieved with non-tunable oscillators. The present tunable signal source achieves both the highest output power and the highest tunability when compared to related art oscillators, including compound semiconductors technologies that have significantly higher cut-off frequencies. The DC to THz conversion efficiency of this work is more than any other CMOS tunable source at this frequency range. However, this efficiency is still below 1%. This is mainly because a large portion of the DC power is converted to the fundamental frequency as well as undesirable harmonics.

CONCLUSION

This disclosure provides a novel oscillator architecture that is suitable for high-power generation in the terahertz region. The coupled oscillator structure introduces a unique power generation and combining method that can produce high harmonic power above the transistor $f_{max}$. As a result of this architecture, power generation and tuning can be performed without affecting each other. Measured output power for the tunable signal source of the present disclosure shows a relatively higher output power and greater tuning range when compared to related art CMOS VCOs. In particular, the tunable signal source of the present disclosure is more comparable to compound semiconductor oscillators having a much higher $f_{max}$.

Those skilled in the art will recognize improvements and modifications to the embodiments of the present disclosure. All such improvements and modifications are considered within the scope of the concepts disclosed herein and the claims that follow.

What is claimed is:

1. A tunable signal source comprising:
    a plurality of oscillator cores each having a coupling input, a coupling output, and a power output that is common to each of the plurality of oscillator cores;
    a plurality of tunable phase shifters wherein corresponding ones of the plurality of tunable phase shifters are communicatively coupled between the coupling input and the coupling output of corresponding ones of the plurality of oscillator cores, thereby forming a loop of alternating ones of the plurality of oscillator cores and alternating ones of the plurality of tunable phase shifters; and
    a plurality of couplers wherein corresponding ones of the plurality of couplers are coupled between corresponding ones of the plurality of tunable phase shifters and corresponding ones of the plurality of oscillator cores to buffer the plurality of oscillator cores from the plurality of tunable phase shifters, wherein coupling modes are controllable via injection of current between the plurality of oscillator cores.

2. The tunable signal source of claim 1 wherein each of the plurality of couplers have differential inputs and differential outputs that are configured to provide substantially equal lengths for two differential signal paths.

3. The tunable signal source of claim 1 wherein a phase shift of a signal propagating through corresponding ones of the plurality of tunable phase shifters coupled to adjacent ones of the plurality of oscillator cores is substantially equal to, where is a number of oscillator cores making up the plurality of oscillator cores.

4. The tunable signal source of claim 1 further including at least one varactor diode with a control voltage input for each of the plurality of tunable phase shifters wherein a control voltage applied to the control voltage input urges a phase shift of a differential signal propagating through corresponding ones of the plurality of tunable phase shifters.

5. The tunable signal source of claim 1 further including a control voltage input for each of the plurality of tunable phase shifters wherein the control voltage input is coupled to a bias input of each of the plurality of tunable phase shifters to provide voltage control of a differential signal propagating through a corresponding one of the plurality of tunable phase shifters without employing varactor diodes.

6. The tunable signal source of claim 1 wherein each of the plurality of oscillator cores have a cross-coupled inductor-capacitor (LC) configuration.

7. The tunable signal source of claim 6 wherein the cross-coupled LC configuration includes a first transistor with a first gate, a first drain, and a first source, and a second transistor with a second gate, a second drain, and a second source.

8. The tunable signal source of claim 7 further including a first gate transmission line coupled to the first gate, a second gate transmission line coupled to the second gate, a first drain transmission line coupled to the first drain, and a second drain transmission line coupled to the second drain wherein the first gate transmission line, the second gate transmission line, the first drain transmission line and the second drain transmission line have lengths that are substantially shorter than a fundamental frequency of operation for the plurality of oscillator cores.

9. The tunable signal source of claim 1 wherein the plurality of oscillator cores and the plurality of tunable phase shifters are implemented in a 65 nm complementary metal oxide semiconductor (CMOS) integrated circuit die.

10. The tunable signal source of claim 1 wherein the plurality of oscillator cores output signals that are combined into an output signal at a common output node.

11. The tunable signal source of claim 10 wherein a fundamental frequency of the output signal at the common output node ranges from about 300 GHz to at least 3 THz.

12. The tunable signal source of claim 10 wherein the output signal has an output power of greater than or equal to −1.2 dBm with a frequency tuning range of at least 4.5% centered around 290 GHz.

13. The tunable signal source of claim 10 wherein the output signal has an output power of greater than or equal to −3.3 dBm with a frequency tuning range of at least 2.6% centered around 320 GHz.

14. The tunable signal source of claim 1 wherein the plurality of tunable phase shifters are configured for maximum power output for an output signal having a frequency equal to a predetermined harmonic frequency of a predetermined fundamental frequency.

15. The tunable signal source of claim 14 wherein the predetermined harmonic frequency is an even harmonic.

16. The tunable signal source of claim 15 wherein the predetermined harmonic frequency is a fourth harmonic frequency.

17. A method of controlling a tunable signal source comprising:
   providing a plurality of oscillator cores each having a coupling input, a coupling output, and a power output that is common to each of the plurality of oscillator cores;
   providing a plurality of tunable phase shifters wherein corresponding ones of the plurality of tunable phase shifters are communicatively coupled between the coupling input and the coupling output of corresponding ones of the plurality of oscillator cores, thereby forming a loop of alternating ones of the plurality of oscillator cores and alternating ones of the plurality of tunable phase shifters;
   providing a plurality of couplers wherein corresponding ones of the plurality of couplers are coupled between corresponding ones of the plurality of tunable phase shifters and corresponding ones of the plurality of oscillator cores to buffer the plurality of oscillator cores from the plurality of tunable phase shifters; and
   tuning a frequency of a desired signal transmitted through the power output by controlling coupling modes between the plurality of oscillator cores.

18. The method of claim 17 wherein the coupling modes are controlled by injecting current between the plurality of oscillator cores.

19. The method of claim 17 wherein tuning the frequency of the desired signal does not utilize varactors.

* * * * *